United States Patent
Uchida

(10) Patent No.: US 9,570,469 B2
(45) Date of Patent: Feb. 14, 2017

(54) ACTIVE-MATRIX SUBSTRATE AND LIQUID-CRYSTAL DISPLAY DEVICE

(71) Applicant: Sharp Kabushiki Kaisha, Osaka-shi, Osaka (JP)

(72) Inventor: Seiichi Uchida, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 14/438,687

(22) PCT Filed: Oct. 18, 2013

(86) PCT No.: PCT/JP2013/078347
§ 371 (c)(1),
(2) Date: Apr. 27, 2015

(87) PCT Pub. No.: WO2014/069260
PCT Pub. Date: May 8, 2014

(65) Prior Publication Data
US 2015/0255491 A1    Sep. 10, 2015

(30) Foreign Application Priority Data
Oct. 29, 2012   (JP) .................................. 2012-237896

(51) Int. Cl.
*G02F 1/1343* (2006.01)
*H01L 27/12* (2006.01)
(Continued)

(52) U.S. Cl.
CPC ......... *H01L 27/1225* (2013.01); *G02F 1/1368* (2013.01); *G02F 1/133345* (2013.01);
(Continued)

(58) Field of Classification Search
CPC ............... H01L 27/1225; H01L 27/124; H01L 27/1255; H01L 29/24; H01L 29/41733; H01L 29/7869; G02F 1/1368; G02F 1/136227; G02F 1/13345; G02F 1/136277; G02F 1/136286
See application file for complete search history.

(56) References Cited

U.S. PATENT DOCUMENTS 5,694,185 A    12/1997 Oh
5,886,757 A    3/1999 Song et al.
(Continued)

FOREIGN PATENT DOCUMENTS

JP    63-170682 A    7/1988
JP    04-166816 A    6/1992
(Continued)

OTHER PUBLICATIONS

Official Official Communication issued in International Patent Application No. PCT/JP2013/078347, mailed on Jan. 21, 2014.

*Primary Examiner* — Charles Chang
(74) *Attorney, Agent, or Firm* — Keating & Bennett, LLP

(57) ABSTRACT

An active matrix substrate (100) includes: a gate electrode (12) formed on a substrate; an oxide semiconductor layer (16); a source electrode (14); a drain electrode (15A); a drain connecting portion (15B) as an extended portion of the drain electrode (15A); a first transparent conductive layer (22, 24); and a second transparent conductive layer (26), wherein: the drain connecting portion (15B) is arranged close to the drain electrode (15A); and the drain electrode (15A) extends from a connecting portion thereof for connection with the oxide semiconductor layer (16), across an edge of the gate electrode (12), and to the drain connecting portion (15B), where a width of the drain electrode (15A) is smaller than a width of the drain connecting portion (15B).

13 Claims, 6 Drawing Sheets

(51) Int. Cl.
  *G02F 1/1333*  (2006.01)
  *G02F 1/1368*  (2006.01)
  *H01L 29/24*  (2006.01)
  *H01L 29/417*  (2006.01)
  *H01L 29/786*  (2006.01)
  *G02F 1/1362*  (2006.01)

(52) U.S. Cl.
  CPC .. *G02F 1/136277* (2013.01); *G02F 1/136286* (2013.01); *H01L 27/124* (2013.01); *H01L 27/1255* (2013.01); *H01L 29/24* (2013.01); *H01L 29/41733* (2013.01); *H01L 29/7869* (2013.01); *G02F 1/136227* (2013.01)

(56) References Cited

U.S. PATENT DOCUMENTS

| | | |
|---|---|---|
| 2002/0113916 A1 | 8/2002 | Hashiguchi et al. |
| 2011/0084272 A1* | 4/2011 | Miyanaga ........... H01L 27/1225 257/43 |
| 2011/0181805 A1* | 7/2011 | Nagami ............ G02F 1/134363 349/43 |
| 2011/0193079 A1 | 8/2011 | Endo et al. |
| 2011/0210327 A1 | 9/2011 | Kondo et al. |
| 2012/0064650 A1 | 3/2012 | Yamazaki et al. |
| 2012/0138922 A1 | 6/2012 | Yamazaki et al. |
| 2012/0280240 A1 | 11/2012 | Sasaki et al. |
| 2013/0001579 A1* | 1/2013 | Jung .................... H01L 27/088 257/72 |

FOREIGN PATENT DOCUMENTS

| | | |
|---|---|---|
| JP | 08-043854 A | 2/1996 |
| JP | 09-292632 A | 11/1997 |
| JP | 10-125933 A | 5/1998 |
| JP | 2002-014371 A | 1/2002 |
| JP | 2006-215060 A | 8/2006 |
| JP | 2008-180807 A | 8/2008 |
| JP | 2009-058913 A | 3/2009 |
| JP | 2011-118252 A | 6/2011 |
| JP | 2012-084866 A | 4/2012 |
| JP | 2012-134475 A | 7/2012 |
| TW | 201145510 A | 12/2011 |
| TW | 201202816 A | 1/2012 |

* cited by examiner

FIG.1
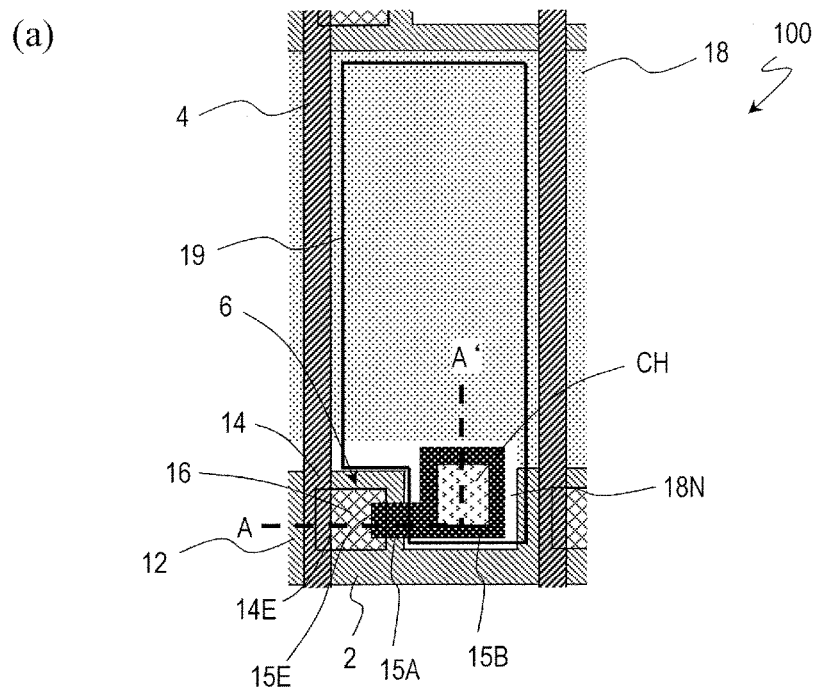
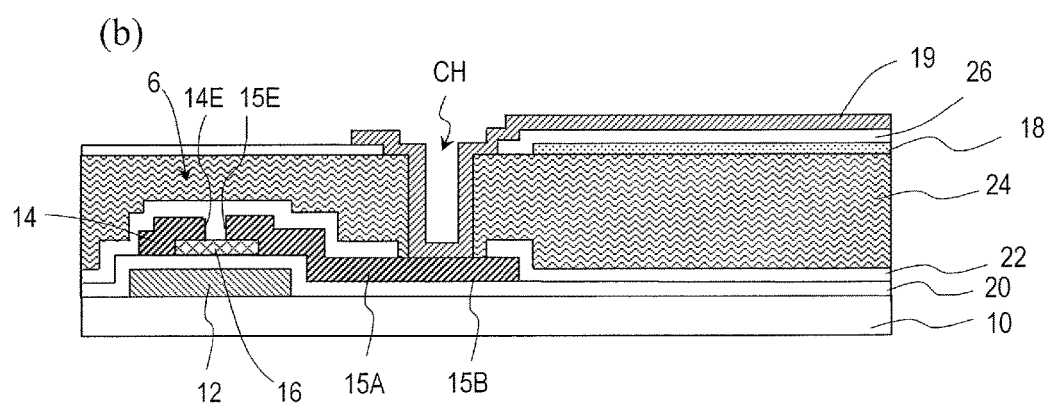

FIG.4
(a)
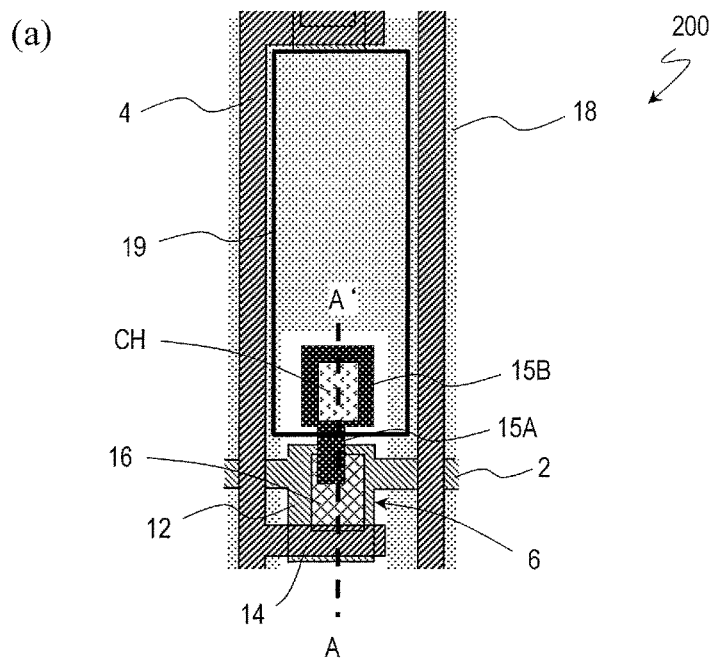
(b)
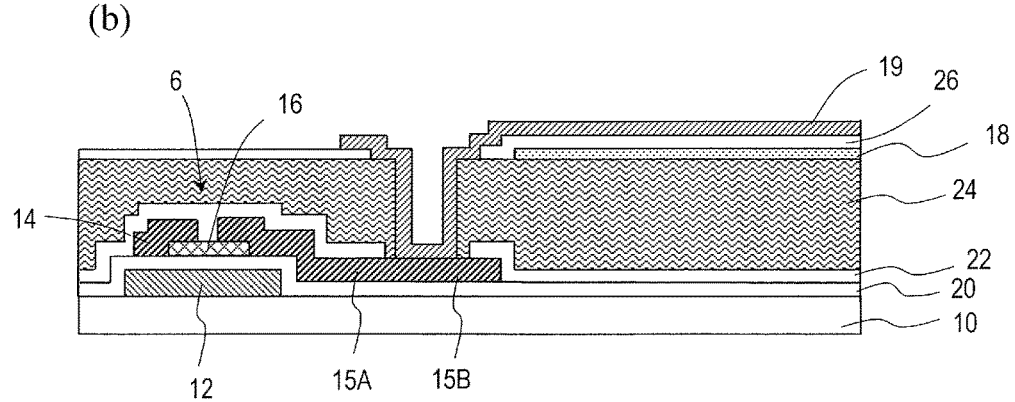

FIG.6
(a)
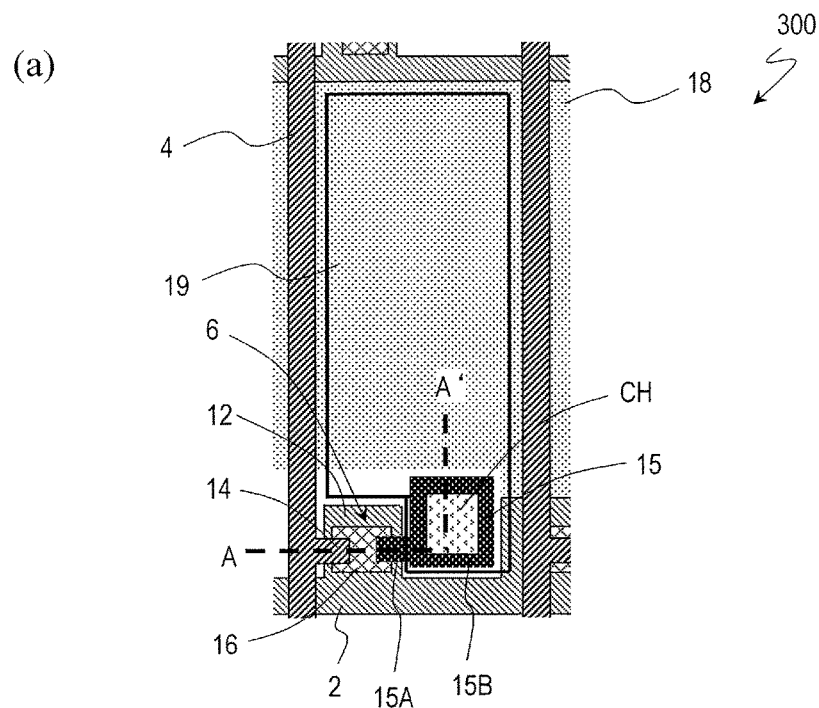
(b)
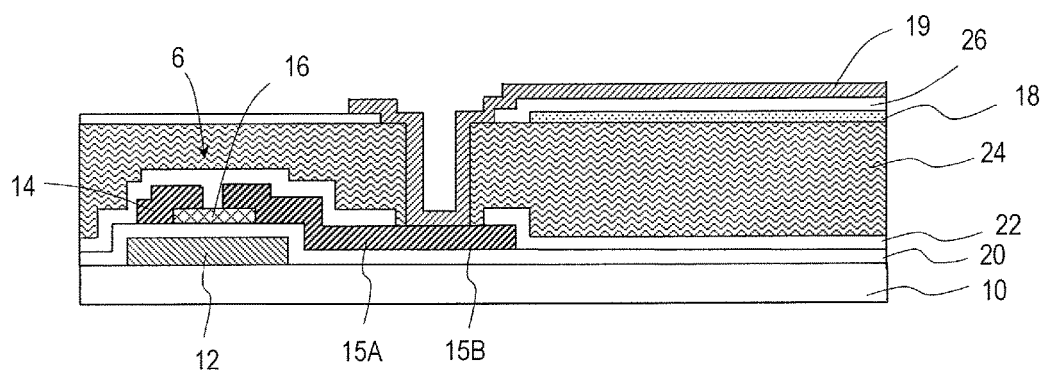

ACTIVE-MATRIX SUBSTRATE AND LIQUID-CRYSTAL DISPLAY DEVICE

TECHNICAL FIELD

The present invention relates to an active matrix substrate and a liquid crystal display device, and particularly to an active matrix substrate and a liquid crystal display device including oxide semiconductor TFTs.

BACKGROUND ART

An active matrix substrate used in a liquid crystal display device, or the like, has a switching element, such as a thin film transistor (hereinafter "TFT"), for each pixel. An active matrix substrate having TFTs as switching elements is called a "TFT substrate".

TFTs that have been used in the art include those using an amorphous silicon film as the active layer (hereinafter "amorphous silicon TFTs"), and those using a polycrystalline silicon film as the active layer (hereinafter "polycrystalline silicon TFTs"). It has been proposed to use an oxide semiconductor, instead of amorphous silicon or polycrystalline silicon, as the material of the active layer of a TFT, (e.g., Patent Document No. 1). Such a TFT is herein referred to as an "oxide semiconductor TFT".

An oxide semiconductor has a higher mobility than amorphous silicon. Therefore, an oxide semiconductor TFT can operate faster than an amorphous silicon TFT. An oxide semiconductor film also has an advantage that it can be formed by a simpler process than a polycrystalline silicon film.

Liquid crystal display devices having oxide semiconductor TFTs have currently been developed. Since an oxide semiconductor TFT has a small size, it is possible to improve the pixel aperture ratio by using this as compared with cases where conventional TFTs are used. Thus, it is possible to realize a brighter display. Or the power consumption can be decreased by reducing the brightness of the backlight.

Using an oxide semiconductor TFT also makes it easier to provide a large storage capacitor Ccs. The storage capacitor Ccs is connected to the drain of the TFT and the liquid crystal capacitor Clc, and is used for retaining the voltage during the TFT OFF period. Even if a large storage capacitor Ccs is provided, it is possible to perform the write operation with generally the same frame frequency as those of conventional techniques because an oxide semiconductor has a high mobility.

In order to obtain a larger storage capacitor Ccs, a configuration is known in the art in which a storage capacitor Ccs is formed by using a pixel electrode, and a transparent conductive layer disposed underneath with an insulating layer interposed therebetween (e.g., Patent Document No. 2). In a configuration where the transparent conductive layer is provided under the pixel electrode, as described above, it is possible to obtain a large storage capacitor Ccs because it is possible to realize a relatively large overlapping area between the pixel electrode and the transparent conductive layer.

CITATION LIST

Patent Literature

[Patent Document No. 1] Japanese Laid-Open Patent Publication No. 2012-134475

[Patent Document No. 2] Japanese Laid-Open Patent Publication No. 2008-180807

[Patent Document No. 3] Japanese Laid-Open Patent Publication No. 2002-014371

[Patent Document No. 4] Japanese Laid-Open Patent Publication No. 10-125933

SUMMARY OF INVENTION

Technical Problem

In a liquid crystal display device, the pixel electrode for applying a voltage through the liquid crystal layer is connected to the oxide semiconductor TFT. When the TFT is ON, a predetermined voltage is applied to the pixel electrode, and when the TFT is OFF, the applied voltage to the pixel electrode is retained. Note however that when the TFT is switched OFF, there occurs a voltage drop referred to as a feed-through voltage (pull-in voltage).

It is known in the art that the magnitude of the feed-through voltage is dependent on the magnitude of the parasitic capacitance Cgd formed between the gate and the drain of the TFT. The magnitude of the parasitic capacitance Cgd varies if the drain electrode is mis-positioned or mis-shaped. Therefore, in a produced TFT substrate, the feed-through voltage may vary from one pixel to another, in which case a display defect (flicker or display unevenness) may occur.

Patent Document No. 3 discloses forming the drain electrode so as to reduce the width of a portion thereof extending across the edge of the gate electrode in order to reduce the variation of the parasitic capacitance Cgd. In the TFT described in Patent Document No. 3, the drain electrode has a larger width in a portion thereof that opposes the source electrode (a portion defining the channel width), and the drain electrode extends therefrom into another portion that has a smaller width extending across the edge of the gate electrode.

With such a configuration, even if there is mis-positioning (misalignment) between the gate electrode and the drain electrode, the variation in the overlapping area between the gate electrode and the drain electrode will be relatively small. Thus, it is possible to suppress the variation of the parasitic capacitance Cgd.

Patent Document No. 4 describes a technique of reducing the overlapping area between the source electrode and the gate electrode, thereby decreasing the parasitic capacitance Cgs. In Patent Document No. 4, the source electrode has a trapezoidal planar shape of which the width decreases in the direction toward the gate electrode.

As described above, various attempts have been made in the art for reducing the parasitic capacitance to be formed between the gate and the drain or between the gate and the source of the TFT. Note however that there is a demand for further improving the display quality by further reducing the parasitic capacitance Cgd.

The present invention has been made in view of the above, and a primary object thereof is to provide an active matrix substrate and a liquid crystal display device with which the display quality is improved.

Solution to Problem

An active matrix substrate according to an embodiment of the present invention includes: a substrate; a gate electrode formed on the substrate; a gate insulating layer formed on the gate electrode; an oxide semiconductor layer formed on the gate insulating layer, at least a portion of the oxide semiconductor layer overlapping with the gate electrode with the gate insulating layer interposed therebetween; a source electrode and a drain electrode electrically connected to the oxide semiconductor layer, the source electrode and the drain electrode arranged so as to oppose each other with a gap therebetween; a drain connecting portion as an extended portion of the drain electrode; a first insulating layer formed on the source electrode, the drain electrode and the drain connecting portion; a first transparent conductive layer provided on the first insulating layer, the first transparent conductive layer provided so as not to overlap with the oxide semiconductor layer and the Solution to Problem drain connecting portion; a second insulating layer formed on the first transparent conductive layer; and a second transparent conductive layer provided on the second insulating layer, the second transparent conductive layer electrically connected to the drain connecting portion through a contact hole formed in the first and second insulating layers, and electrically connected to the first transparent conductive layer, wherein: the drain connecting portion has a size larger than a size of the contact hole, and is arranged close to the drain electrode; and the drain electrode extends from a connecting portion thereof for connection with the oxide semiconductor layer, across an edge of the gate electrode, and to the drain connecting portion, where a width of the drain electrode is smaller than a width of the drain connecting portion.

In one embodiment, a storage capacitor is formed by the first transparent conductive layer, the second insulating layer, and the second transparent conductive layer, and the drain connecting portion does not form a storage capacitor.

In one embodiment, the second transparent conductive layer includes a plurality of pixel electrodes; and the first transparent conductive layer is provided so as to oppose the plurality of pixel electrodes, and has a plurality of openings therein corresponding to areas including the oxide semiconductor layer and the drain connecting portion.

In one embodiment, a width of an end portion of the drain electrode that opposes the source electrode is equal to a width of a portion of the drain electrode that extends across the edge of the gate electrode.

In one embodiment, a linear edge is formed along an end portion of the drain electrode that opposes the source electrode, and a linear edge opposing the linear edge of the drain electrode and extending in a direction parallel to the linear edge of the drain electrode is formed along a portion of the source electrode that opposes the drain electrode; and a length of the edge along the end portion of the drain electrode is different from a length of the edge of the source electrode.

In one embodiment, the oxide semiconductor layer has a planar shape of an island-like pattern; and the source electrode extends linearly across the oxide semiconductor layer, and the linear edge of the source electrode is formed over an area where the source electrode extends linearly across the oxide semiconductor layer.

In one embodiment, a connecting portion between the source electrode and the oxide semiconductor layer, a connecting portion between the drain electrode and the oxide semiconductor layer, and the drain connecting portion are aligned together.

In one embodiment, the active matrix substrate further includes: a gate line connected to the gate electrode; and a source line connected to the source electrode and extending across the gate line, wherein as seen from a substrate normal direction, the source line is extending across the oxide semiconductor layer, and the source electrode is a portion of the source line.

In one embodiment, The active matrix substrate further includes: a gate line connected to the gate electrode; and a source line connected to the source electrode and extending across the gate line, wherein the connecting portion between the source electrode and the oxide semiconductor layer, the connecting portion between the drain electrode and the oxide semiconductor layer, and the drain connecting portion are aligned together along the source line.

In one embodiment, a width of the drain connecting portion is 10 µm or more and 15 µm or less, and a width of the drain electrode is 1 µm or more and 6 µm or less.

In one embodiment, the oxide semiconductor layer is formed by an In—Ga—Zn—O-based oxide semiconductor.

In one embodiment, the In—Ga—Zn—O-based oxide semiconductor is crystalline.

A liquid crystal display device of the present invention includes: any one of the active matrix substrates set forth above; a counter substrate arranged so as to oppose the active matrix substrate; and a liquid crystal layer held between the active matrix substrate and the counter substrate, wherein the second transparent conductive layer includes a pixel electrode, and the liquid crystal display device is driven in a vertical electric field mode.

Advantageous Effects Of Invention

With the embodiments of the present invention, it is possible to obtain an active matrix substrate that can suitably be used in a liquid crystal display device, and it is possible to improve the display quality.

BRIEF DESCRIPTION OF DRAWINGS

FIG. 1 (*a*) is a schematic plan view of an active matrix substrate according to Embodiment 1 of the present invention, and (*b*) is a schematic cross-sectional view taken along line A-A' of (*a*).

FIG. 4 (*a*) is a schematic plan view of an active matrix substrate according to Embodiment 2 of the present invention, and (*b*) is a schematic cross-sectional view taken along line A-A' of (*a*).

FIG. 6 (*a*) is a schematic plan view of an active matrix substrate according to Embodiment 3 of the present invention, and (b) is a schematic cross-sectional view taken along line A-A' of (*a*).

DESCRIPTION OF EMBODIMENTS

Figure 2:
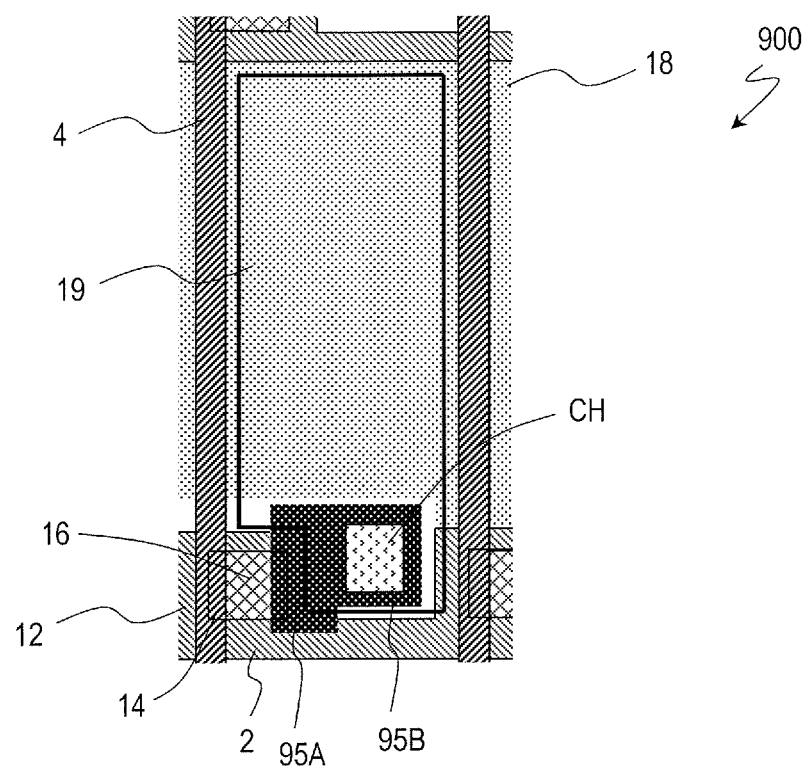
FIG. 2 A schematic plan view of an active matrix substrate of a comparative example.

Active matrix substrates (TFT substrates) of embodiments of the present invention will now be described with reference to the drawings. The TFT substrates to be described below are suitably used in liquid crystal display devices that operate in a vertical electric field mode (e.g., the VA (Vertical Alignment) mode, the TN (Twisted Nematic) mode, etc.). Note however that the present invention is not limited thereto, and they may be TFT substrates used in display devices of a lateral electric field mode such as the FFS (Fringe Field Switching) mode.

(Embodiment 1)

FIG. 1(a) is a schematic plan view showing an area corresponding to one pixel of a TFT substrate 100 according to Embodiment 1 of the present invention. FIG. 1(b) is a schematic cross-sectional view taken along line A-A' of FIG. 1(a). Note that although not shown in the figures, the TFT substrate 100 is provided with a plurality of pixels in a matrix pattern, and each pixel has a structure shown in FIGS. 1(a) and 1(b).

As shown in FIGS. 1(a) and 1(b), the TFT substrate 100 includes a substrate 10, a gate line 2 and a gate electrode 12 formed on the substrate 10, a gate insulating layer 20 formed on the gate electrode 12, and an oxide semiconductor layer 16 arranged so as to overlap with the gate electrode 12 with the gate insulating layer 20 interposed therebetween. The gate line 2 extends along the horizontal direction, and the gate electrode 12 is formed integral with the gate line 2.

The TFT substrate 100 also includes a source line 4 and a source electrode 14 electrically connected to the oxide semiconductor layer 16, and a drain electrode 15A. The source electrode 14 and the drain electrode 15A are arranged so as to oppose each other with a gap therebetween over the oxide semiconductor layer 16 provided in an island-like pattern.

The source line 4 extends along the vertical direction so as to be perpendicular to the direction in which the gate line 2 extends. A portion of the source line 4 is connected to the oxide semiconductor layer 16 in the vicinity of an intersection between the source line 4 and the gate line 2. In the present embodiment, this portion of the source line 4 functions as the source electrode 14. That is, the source electrode 14 is a portion of the source line 4.

An oxide semiconductor TFT 6 is formed by the gate electrode 12, the oxide semiconductor layer 16, the source electrode 14, the drain electrode 15A, etc., described above. When an ON voltage is applied to the gate electrode 12 via the gate line 2, the oxide semiconductor TFT 6 is turned ON, thereby electrically connecting the source electrode 14 and the drain electrode 15A with each other via the oxide semiconductor layer 16.

Note that the present embodiment employs a configuration where a portion of the source line 4 functions as the source electrode 14 (i.e., the source line 4 and the oxide semiconductor layer 16 are connected with each other), and the gate electrode 12 is also present under the source line 4.

In the TFT substrate 100, a drain connecting portion 15B is provided as an extended portion of the drain electrode 15A. The drain connecting portion 15B is provided integral with, and in the vicinity of, the drain electrode 15A, and is a portion (contact portion) for electrically connecting a pixel electrode 19 and the drain electrode 15A with each other. The drain connecting portion 15B is provided so as not to overlap with the gate line 2 and the gate electrode 12.

The drain electrode 15A includes a portion extending across the edge of the oxide semiconductor layer 16, and a portion extending across the edge of the gate electrode 12. Now, the drain electrode 15A corresponds to a portion extending from an end portion thereof that is closer to the source electrode 14 (which forms a connecting portion for the connection with the oxide semiconductor layer 16) to the drain connecting portion 15B, and extends at least from the connecting portion for the connection with the oxide semiconductor layer 16 to the portion which extends across the edge of the gate electrode 12 (i.e., a portion overlapping with the gate electrode 12). The width of the drain electrode 15A as used herein means the length of any portion of the drain electrode 15A in a direction that is perpendicular in-plane to the direction in which it extends from the connecting portion for the connection with the oxide semiconductor layer 16, across the edge of the gate electrode 12, and to the drain connecting portion 15B (i.e., a direction generally parallel to the source line 4 in the present embodiment).

The width of the drain electrode 15A is smaller than the width of the drain connecting portion 15B. More specifically, the drain electrode 15A has a small width at least in the end portion of the drain electrode 15A that is closer to the source electrode 14 and the portion thereof extending across the edge of the gate electrode 12. As can be seen from the figure, the width of the drain electrode 15A is smaller than the width of the oxide semiconductor layer 16 in the present embodiment. Note that the width of the drain connecting portion 15B and the width of the oxide semiconductor layer 16 refer to the length of the drain connecting portion 15B and the length of the oxide semiconductor layer 16 in the same direction as the direction in which the width of the drain electrode 15A is defined.

The width of the drain electrode 15A is set to 1 μm to 6 μm, for example. The width of the drain connecting portion 15B is set to 10 μm to 15 μm, for example. The width of the oxide semiconductor layer 16 is set to 4 μm to 8 μm, for example. Note however that the width of the drain electrode 15A is preferably set to be smaller than the width of the oxide semiconductor layer 16.

A linear edge 15E is formed along one end portion of the drain electrode 15A that is closer to the source electrode 14. A linear edge 14E opposing the linear edge 15E of the drain electrode 15A and extending in the direction generally parallel to the linear edge 15E is formed along a portion of the source electrode 14 that opposes the drain electrode 15A. The edge 14E of the source electrode 14 is formed so as to extend linearly across the oxide semiconductor layer 16. In the present embodiment, the length of the edge 14E of the source electrode 14 is larger than the length of the edge 15E of the drain electrode 15A, thereby forming the oxide semiconductor TFT 6 of which the channel width is not constant.

In the TFT substrate 100, the oxide semiconductor TFT 6 and the drain connecting portion 15B (contact portion) are arranged close to each other. The connecting portion between the source electrode 14 and the oxide semiconductor layer 16, the connecting portion between the drain electrode 15A and the oxide semiconductor layer 16, and the drain connecting portion 15B are aligned together. With such an arrangement, it is possible to increase the pixel aperture ratio, and with the width of the drain electrode 15A being small, it is possible to reduce the overlapping area between the drain electrode 15A and the gate electrode 12, or the parasitic capacitance Cgd.

As shown in FIG. 1(b), the TFT substrate 100 further includes a passivation layer 22 and an interlayer insulating layer (planarizing layer) 24, which are insulating layers formed over the source electrode 14, the drain electrode 15A, etc. One or both of these insulating layers may be referred to herein as the first insulating layer.

A transparent shield electrode layer (first transparent conductive layer) 18 is provided on the first insulating layer 22, 24. The pixel electrode 19 is provided over the transparent shield electrode layer 18 with a second insulating layer 26 interposed therebetween.

The pixel electrode 19 and the transparent shield electrode layer 18 are insulated from each other, and are provided so as to at least partially overlap with each other as seen from the substrate normal direction. In this configuration, a storage capacitor is formed by the pixel electrode 19, the transparent shield electrode layer 18, and the second insulating layer 26 interposed therebetween. An intended data voltage is applied to the pixel electrode 19, and the same voltage as the voltage applied to the counter electrode on the counter substrate to be described below (common voltage) is applied to the transparent shield electrode layer 18, for example. Since there is a relatively large storage capacitor as described above, the drain connecting portion 15B is not used for forming the storage capacitor.

The pixel electrode 19 is electrically connected to the drain connecting portion 15B through a contact hole CH. The contact hole CH is formed by an opening provided in the first insulating layer 22, 24 and an opening provided in the second insulating layer 26. The contact hole CH is formed in a region that is inside the drain connecting portion 15B, and the size of the drain connecting portion 15B is larger than the size of the bottom surface of the contact hole CH.

Now, as shown in FIGS. 1(*a*) and 1(*b*), the transparent shield electrode layer 18 is provided so as not to overlap with the oxide semiconductor layer 16 and the drain connecting portion 15B. The transparent shield electrode layer 18 is provided as a shared element for the plurality of pixels. Thus, the transparent shield electrode layer 18 is in a form extending across the entire surface, including openings 18N each at a position corresponding to the drain connecting portion 15B and the oxide semiconductor TFT 6 (the oxide semiconductor layer 16). Note however that the transparent shield electrode layer 18 may have a configuration where it is divided into separate pieces for separate pixels.

In the TFT substrate 100 having such a configuration, since the drain electrode 15A is formed to have a small width in the connecting portion for the connection with the oxide semiconductor layer 16, the parasitic capacitance Cgd (the overlapping area between the drain electrode 15A and the gate electrode 12) in each pixel is relatively small. In this configuration, even when the final dimension of the gate electrode 12 varies due to manufacturing process variations or when the magnitude of misalignment between the gate electrode 12 and the drain electrode 15A varies from one pixel to another in the substrate plane, it is possible to suppress the variation in the parasitic capacitance Cgd. Therefore, the magnitude of the feed-through voltage can be made relatively small, and it is possible to suppress the variation of the feed-through voltage in the substrate plane. Thus, where the TFT substrate 100 is used in a liquid crystal display device, it is possible to suppress flicker or display unevenness.

In order to reduce the pixel-to-pixel variation of the feed-through voltage due to the difference in the parasitic capacitance Cgd, it is preferred that the storage capacitance Ccs and the liquid crystal capacitance Clc (which may be referred to collectively as a pixel capacitance) is large. Note however that even if the pixel capacitance can be made large, there arises a problem with an amorphous silicon TFT that the write operation cannot be performed with such a frame frequency as those of conventional techniques.

In contrast, in the present embodiment, since the oxide semiconductor TFT 6 is used, even if the pixel capacitance is increased, it is possible to perform the write operation with generally the same frame frequency as those of conventional techniques. Therefore, it is possible to obtain a large storage capacitance while maintaining the write speed, and it is therefore possible to effectively suppress the variation of the feed-through voltage.

Where the oxide semiconductor TFT 6 is used, if a low frequency driving operation (e.g., about 1 Hz) is performed in order to reduce the power consumption, brightness variations are more likely to be observed as flicker. In view of this, the flicker, and the like, can be suppressed by reducing the parasitic capacitance Cgd while forming a large storage capacitor as in the present embodiment. Thus, the configuration of the present embodiment is particularly advantageous when the oxide semiconductor TFT 6 is used.

Note that where an amorphous silicon TFT or a polycrystalline silicon TFT is used, since the off-leakage current is relatively large and the voltage retention rate is therefore likely to lower, it is difficult in the first place to employ the low frequency driving method. When these TFTs are used, it is difficult to achieve a driving operation at 5 Hz or lower, for example. In contrast, with the TFT substrate 100 of the present embodiment, it is possible to achieve a driving operation at 5 Hz or lower, or even a driving operation at 1 Hz or lower, while suppressing flicker.

Note that where the TFT substrate 100 is applied to a display device of the lateral electric field mode, the pixel electrode 19 may have a comb tooth shape. Where it is used in a display device of the FFS mode, the pixel electrode 19 may have a plurality of slits therein, and the transparent shield electrode layer 18 may be used as the common electrode. Also in such a case, a storage capacitor can be formed in an area where the pixel electrode 19 and the common electrode overlap with each other, and the drain connecting portion 15B does not need to be used for the formation of a storage capacitor.

Next, configurations and production methods of various components of the TFT substrate 100 will be described in greater detail.

The substrate 10 is typically a transparent substrate, and is a glass substrate, for example. Other than a glass substrate, it may be a plastic substrate. A plastic substrate may be a substrate formed by a thermosetting resin or a thermoplastic resin, or a composite substrate between such a resin and an inorganic fiber (e.g., a glass fiber, a non-woven fabric of a glass fiber). Polyethylene terephthalate (PET), polyethylene naphthalate (PEN), polyether sulfone (PES), an acrylic resin, or a polyimide resin, may be used as a heat-resistant resin material.

The gate line 2 and the gate electrode 12 may have a layered structure, e.g., the upper layer may be made of a W (tungsten) layer and the lower layer of a TaN (tantalum nitride) layer. Alternatively, it may have a layered structure formed by Mo (molybdenum)/Al (aluminum)/Mo, and it may of course have a single-layer structure. The conductive material of the gate line 2 and the gate electrode 12 may be an element selected from Cu (copper), Al, Cr (chromium), Ta (tantalum), Ti (titanium), Mo and W, or may be an alloy or a metal nitride thereof.

The gate line 2 and the gate electrode 12 may be formed by forming a conductive film (e.g., a layered structure of W (thickness: 300 nm)/TaN (thickness: 30 nm)) by a sputtering method, for example, on the substrate 10, and then patterning it by a photolithography method, a wet or dry etching method, etc.

The gate insulating layer 20 may be a single-layer or multi-layer structure formed by SiO2 (silicon oxide), $SiN_x$ (silicon nitride), $SiO_xN_y$ (silicon oxynitride, where x>y), $SiN_xO_y$ (silicon nitride oxide, where x>y), $Al_2O_3$ (aluminum oxide), tantalum oxide ($Ta_2O_5$), etc., for example. The thickness of the gate insulating layer 20 is about 50 nm or more and 600 nm or less, for example. Note that in order to form a compact gate insulating layer 20 with little gate leakage current at a low temperature, the gate insulating layer 20 may be formed while using a rare gas such as Ar (argon). The gate insulating layer 20 can be obtained by depositing a layered structure of $SiO_2$ (thickness: 50 nm)/ $SiN_x$ (thickness: 325 nm), for example, by a plasma CVD method, for example.

The oxide semiconductor layer 16 may be formed by any of various materials, and an In—Ga—Zn—O-based amorphous oxide semiconductor containing In, Ga and Zn at a ratio of 1:1:1, for example, can suitably be used. Note however that the ratio between In, Ga and Zn is not limited to the above ratio, and any suitable ratio can be selected. Any other suitable oxide semiconductor may be used, instead of an In—Ga—Zn—O-based semiconductor.

The oxide semiconductor layer 16 is formed by, for example, an $InGaO_3(ZnO)_5$ film, magnesium zinc oxide ($Mg_xZn_{1-x}O$), cadmium zinc oxide ($Cd_xZn_{1-x}O$), or cadmium oxide (CdO), etc. It may also be formed by ZnO to which one or more impurity elements are added, selected from group 1 elements, group 13 elements, group 14 elements, group 15 elements or group 17 elements, etc. There may be no impurity element added to ZnO. ZnO may be in an amorphous state, in a polycrystalline state, or in a microcrystalline state where the amorphous state and the polycrystalline state coexist.

An amorphous In—Ga—Zn—O-based semiconductor has an advantage that it can be produced at a low temperature, and it is possible to achieve a high mobility. Note however that a crystalline In—Ga—Zn—O-based semiconductor may be used, instead of an amorphous In—Ga—Zn—O-based semiconductor. A crystalline In—Ga—Zn—O-based semiconductor layer is preferably a crystalline In—Ga—Zn—O-based semiconductor layer of which the c axis is oriented generally vertical to the layer plane. A crystalline structure of such an In—Ga—Zn—O-based semiconductor layer is disclosed in Patent Document No. 1, for example. The oxide semiconductor layer 16 can be obtained by depositing an In—Ga—Zn—O-based semiconductor film (thickness: 50 nm) by a sputtering method, for example, and patterning it into an intended shape (typically, an island-like pattern) by a photolithography process.

The source line 4, the source electrode 14, the drain electrode 15A and the drain connecting portion 15B may have a single-layer structure or may have a layered structure. There is no particular limitation on the material of the metal film for the source line, and one can suitably use a film including a metal such as aluminum (Al), tungsten (W), molybdenum (Mo), tantalum (Ta), copper (Cu), chromium (Cr), titanium (Ti), etc., or an alloy thereof or a metal nitride thereof.

The source line 4, the source electrode 14, the drain electrode 15A and the drain connecting portion 15B can be formed by, for example, depositing a conductive film (e.g., a layered structure of Ti (thickness: 100 nm)/Al (thickness: 200 nm)/Ti (thickness: 30 nm)), and patterning it into an intended shape by a photolithography process. The drain electrode 15A and the drain connecting portion 15B are formed integral with each other, with the respective widths being preferably 1 μm to 6 μm and 10 μm to 15 μm.

Note that in the process described above, if the process of separating the source electrode 14 and the drain electrode 15A from each other through etching, an etching damage may possibly be inflicted on the oxide semiconductor layer 16 underneath. In order to prevent this, an etching stopper layer made of $SiO_2$, or the like, may be provided so as to cover at least the channel region of the oxide semiconductor layer 16, after the provision of the oxide semiconductor layer 16. Forming the etching stopper layer by an oxide such as $SiO_2$ is advantageous because it is then possible to restore oxygen defects of the oxide semiconductor layer 16.

The passivation layer 22 can be obtained, for example, by depositing an $SiO_2$ film having a thickness of 300 nm by a plasma CVD method. Note that the passivation layer 22 may be formed by $SiO_{xy}$ (silicon oxynitride, where x>y), $SiN_xO_y$ (silicon nitride oxide, where x>y), $Al_2O_3$ (aluminum oxide), or $Ta_2O_5$ (tantalum oxide), etc. The planarizing layer 24 can be obtained by applying, and then curing, a photosensitive organic film on the passivation layer 22.

A contact hole CH is formed by a photolithography process, or the like, in a region of the passivation layer 22 and the planarizing layer 24 that corresponds to the drain connecting portion 15B. After forming the contact hole CH in the planarizing layer 24, an opening may be formed in the passivation layer 22 by etching using the planarizing layer 24 as a mask. The contact hole CH is formed so that the drain connecting portion 15B is exposed on the bottom surface thereof. The size of the contact hole CH (the length of each side where it has a square shape) is set to 7 μm to 10 μm, for example.

The pixel electrode 19 and the transparent shield electrode layer 18 are each formed by, for example, a transparent conductive film (e.g., an ITO (Indium Tin Oxide) or IZO (registered trademark) (Indium Zinc Oxide) film). The thickness of the pixel electrode 19 and the transparent shield electrode layer 18 is 20 nm or more and 200 nm or less, for example. The second insulating layer 26 interposed therebetween is formed by an $SiN_x$ film (thickness: 200 nm), for example.

The transparent shield electrode layer 18 can be obtained by, for example, depositing a transparent conductive film (e.g., an IZO film having a thickness of 100 nm) by a sputtering method, and processing it into an intended shape by a photolithography process. In this process, the opening 18N is formed over a region corresponding to the oxide semiconductor TFT 6 and the drain connecting portion 15B (and the contact hole CH) so as not to cover these elements.

The second insulating layer 26 is formed into an intended shape by a photolithography process, or the like, so as to have an opening at a position corresponding to the contact hole CH provided in the first insulating layer 22, 24. Note however that the second insulating layer 26 is desirably formed so as to completely cover the transparent shield electrode layer 18, and the opening of the second insulating layer 26 is therefore formed inside the opening 18N of the transparent shield electrode layer 18.

The pixel electrode 19 can be obtained by depositing a transparent conductive film (e.g., an IZO film having a thickness of 100 nm) by a sputtering method, and processing it into an intended shape by a photolithography process. The pixel electrode 19 is formed so as to be in contact with the surface of the drain connecting portion 15B in the contact hole CH. The pixel electrode 19 is provided so as to be insulated from the transparent shield electrode layer 18, and is provided so as to overlap with at least a part of the transparent shield electrode layer 18 with the second insulating layer 26 interposed therebetween.

In the present embodiment, the pixel electrode 19 is typically provided so as to correspond to a region (pixel region) that is surrounded by a pair of adjacent source lines 4 and a pair of adjacent gate lines 2. Note however that the pixel electrode 19 preferably has a notch portion so as not to cover the oxide semiconductor TFT 6.

A reason why the parasitic capacitance Cgd varies from one pixel to another during the process of manufacturing an ordinary TFT substrate will be stated below.

In the process of forming the source electrode 14 and the drain electrode 15A, one display region may be subjected to divided exposure by a step and repeat method using a plurality of photomasks or one photomask. Then, the amount of misalignment may differ from one exposed area to another. In such a case, areas of different magnitudes of the parasitic capacitance Cgd are formed in blocks or strips, corresponding to the shape of the exposed areas. Even if divided exposure is not used, there may be rotational misalignment. Moreover, in the process of forming the gate line 2 and the gate electrode 12, the dimension may vary from one row to another. Also in such cases, the magnitude of the parasitic capacitance Cgd varies from one pixel to another.

In contrast, according to the present embodiment, even if the parasitic capacitance Cgd varies in the manufacturing process as described above, the difference thereof (the degree of variation) can be made relatively small because the drain electrode 15A is formed with a small width. Thus, it is possible to suppress flicker or display unevenness, and to improve the display quality.

Where a liquid crystal display device is reduced by using the TFT substrate 100 of the present embodiment, a counter substrate opposing the TFT substrate 100 with a gap therebetween can be provided, with a liquid crystal layer being held between these substrates.

A counter substrate can be obtained by, for example, depositing a light-blocking film (e.g., a Ti film having a thickness of 200 nm) on a glass substrate, processing it into an intended shape by a photolithography process, then depositing an insulating film (e.g., an $SiO_2$ film having a thickness of 200 nm), and further depositing a transparent conductive film (e.g., an ITO film having a thickness of 100 nm) by a sputtering method. For producing color display, color filters of three colors (RGB), for example, may be provided. Photo spacers for maintaining the gap between the counter substrate and the glass substrate may be provided on the counter substrate. Note that the color filters and the photo spacers may be provided on the TFT substrate 100.

A liquid crystal panel can be produced by, for example, attaching the TFT substrate 100 and the counter substrate together with a gap therebetween using a sealant, and then injecting a liquid crystal material into the gap between the substrates surrounded by the sealant. Other than this, a liquid crystal panel may be produced by providing a sealant and photo spacers on the counter substrate, dripping a liquid crystal material thereonto, and then attaching the TFT substrate 100 thereon. Note that where a plurality of liquid crystal panels are manufactured by using a single mother glass, a division process is performed for dividing it into liquid crystal panels.

Where a transmission-type liquid crystal display device is produced, a backlight unit is provided on the back side (the TFT substrate side) of the liquid crystal panel.

Various optical elements, such as a diffusion film, are provided on the backlight unit.

The TFT characteristic observed when the TFT substrate 100 of Embodiment 1 described above is used, and that observed when a TFT substrate 900 of a comparative example (see FIG. 2) is used will be described below.

FIG. 2 is a plan view showing a configuration of the TFT substrate 900 of the comparative example. As shown in the figure, in the TFT substrate 900, the width of a drain electrode 95A is generally equal to, or greater than, the width of a drain connecting portion 95B. Therefore, there is a large overlap between the drain electrode 95A and the gate electrode 12, and the parasitic capacitance Cgd will also be relatively large. When misalignment, or the like, occurs, the degree of in-plane variation of the parasitic capacitance Cgd will likely be high.

Note however that with the TFT substrate 900, since the drain electrode 95A has a large width, the channel width of the TFT is formed constant, and the connectivity between the oxide semiconductor layer 16 and the drain electrode 95A is good.

Figure 3:
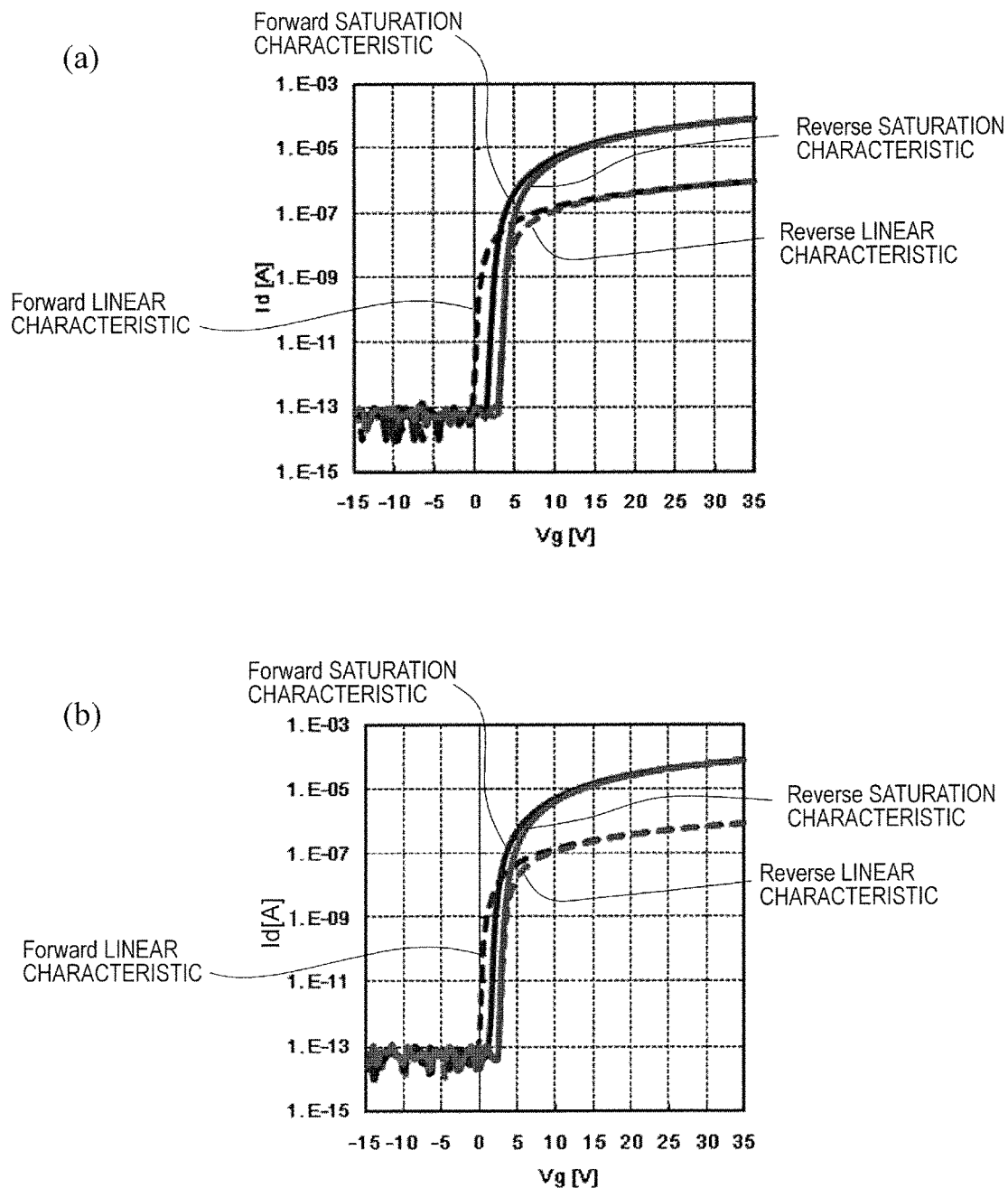
FIG. 3 (*a*) is a graph showing the TFT characteristic of the active matrix substrate of Embodiment 1 of the present invention, and (*b*) is a graph showing the TFT characteristic of the active matrix substrate of the comparative example.

FIGS. 3(a) and 3(b) show the gate voltage-drain current characteristic (hereinafter referred to as the TFT characteristic) for the TFT substrate 100 of Embodiment 1, and the TFT characteristic for the TFT substrate 900 of the comparative example shown in FIG. 2. As can be seen from a comparison between FIG. 3(a) and FIG. 3(b), these characteristics are generally equal to each other. That is, it can be seen that the TFT device characteristic does not deteriorate even if such a TFT structure as that shown in FIG. 1 is employed.

Therefore, if the TFT substrate 100 of the present embodiment is used it is possible to reduce the parasitic capacitance Cgd and the variation thereof, while keeping a desirable TFT device characteristic, and it is therefore possible to improve the display quality.

According to an experiment by the present inventor, the TFT substrate 900 of the comparative example (FIG. 2) had a parasitic capacitance Cgd of 6.5 fF (femtofarads) and a feed-through voltage variation of 65 mV, whereas the TFT substrate 100 of Embodiment 1 had a parasitic capacitance Cgd of 4.3 fF, and the feed-through voltage variation was reduced to 26 mV.

The parasitic capacitance Cgd also includes the fringe capacitance of the gate electrode and the drain electrode, in addition to the overlap capacity of the gate electrode and the drain electrode. Since the overlap capacity accounts for the largest proportion, it is possible to efficiently reduce the parasitic capacitance Cgd by reducing the overlapping area.

Note that the variation of the feed-through voltage described above represents the difference between a gate feed-through voltage value (which is obtained based on the calculation of the parasitic capacitance Cgd assuming a case where the line width of the gate and the drain shifts by a certain value (e.g., 0.5 μm)) and a feed-through voltage value obtained for a case where the line width does not shift.

With the liquid crystal panel produced by using the TFT substrate 900 of the comparative example, black-and-white unevenness was observed on the display screen. It is believed that this is because the gate line width varies in the panel plane, and the parasitic capacitance Cgd and the feed-through voltage thereof vary accordingly. On the other hand, with the liquid crystal panel using the TFT substrate 100 of Embodiment 1, no display unevenness was observed since the parasitic capacitance Cgd and the variation thereof are suppressed.

(Embodiment 2)

A TFT substrate 200 of Embodiment 2 will now be described. A main difference between the TFT substrate 200 and the TFT substrate 100 of Embodiment 1 is that the oxide semiconductor TFT 6 and the drain connecting portion 15B (contact portion) are arranged in the longitudinal direction (along the source line 4). Note that like components to those of the TFT substrate 100 will be denoted by like reference numerals and will not be discussed redundantly.

FIG. 4(a) is a schematic plan view showing an area corresponding to one pixel of the TFT substrate 200 according to Embodiment 2 of the present invention. FIG. 4(b) is a schematic cross-sectional view of the TFT substrate 200 taken along line A-A' of FIG. 4(a).

As shown in FIGS. 4(a) and 4(b), in the present embodiment, the oxide semiconductor TFT 6 and the drain connecting portion 15B are arranged in the longitudinal direction the pixel, which is longer in the up-down direction, i.e., in the direction along which the source line 4 extends.

In this configuration, the source electrode 14 branches off the source line 4 and extends in the direction perpendicular to the direction in which the source line 4 extends, and the source electrode 14 is connected to the oxide semiconductor layer 16 over the gate electrode 12. The source electrode 14 extends across the oxide semiconductor layer 16.

On the other hand, as in Embodiment 1, the drain electrode 15A has a width (the length in the direction generally perpendicular to the source line 4 in the present embodiment) that is smaller than the drain connecting portion 15B and the oxide semiconductor layer 16, and is connected to the oxide semiconductor layer 16. In this configuration, the length of the edge of the source electrode 14 opposing the drain electrode 15A is longer than the length of the edge of the drain electrode 15A opposing the source electrode 14.

Also in the present embodiment, the connecting portion between the source electrode 14 and the oxide semiconductor layer 16, the connecting portion between the oxide semiconductor layer 16 and the drain electrode 15A, and the drain connecting portion 15B are generally aligned together. Note however that the direction of arrangement is generally parallel to the direction in which the source line 4 extends, and is different from that of Embodiment 1 by 90°.

Such a configuration is advantageous, for example, in a case where the pixel pitch is small, and it is therefore difficult to arrange the oxide semiconductor TFT 6 next to the contact portion (the drain connecting portion 15B and the contact hole CH) in the transverse direction (the direction in which the gate line 2 extends) as in Embodiment 1. In Embodiment 2, since the oxide semiconductor TFT 6 and the contact portion are arranged in the longitudinal direction, it is possible to reduce the length of the device portion in the transverse direction.

Figure 5:
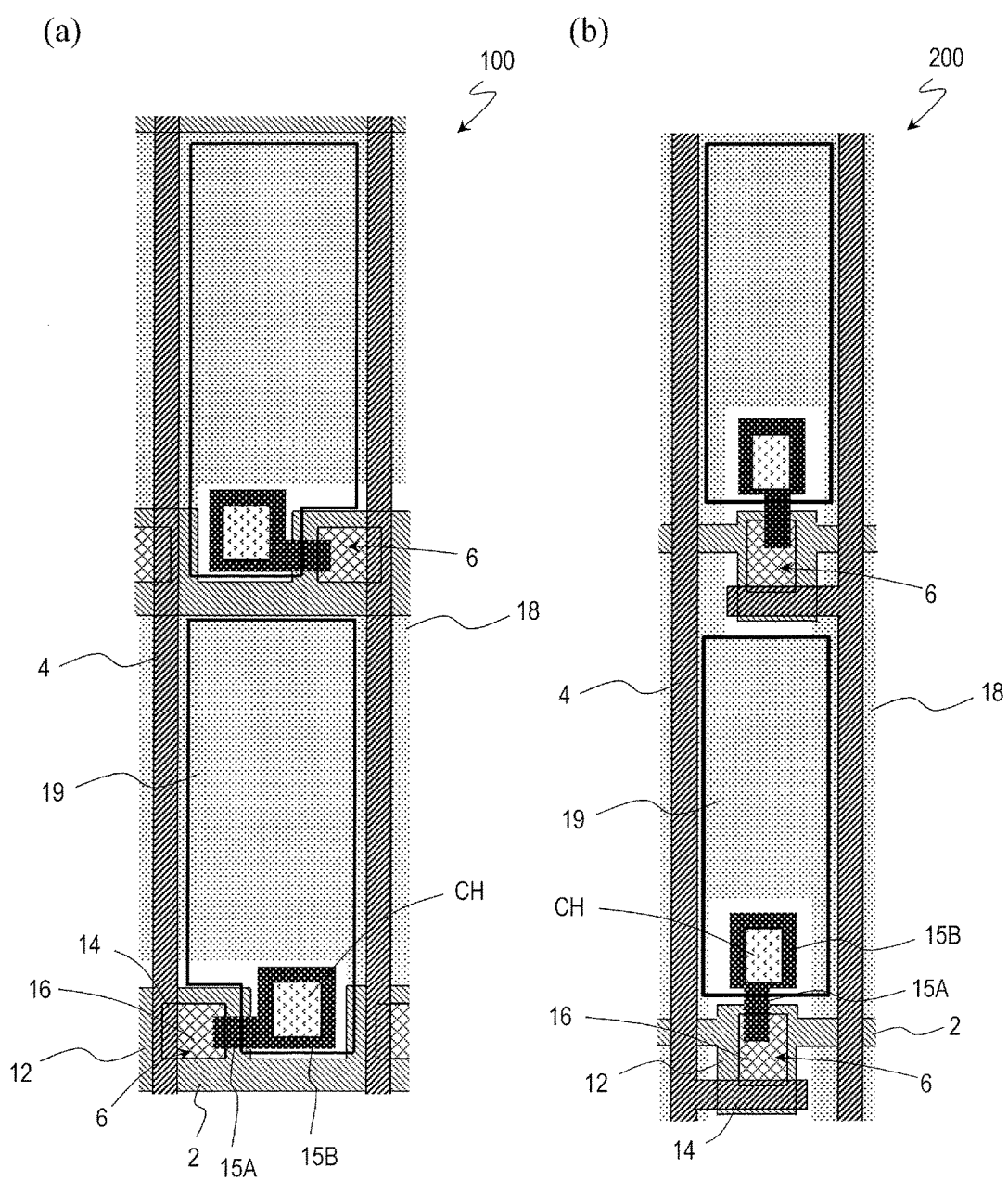
FIG. 5 (*a*) is a schematic plan view showing an area corresponding to two pixels of the active matrix substrate of Embodiment 1, and (*b*) is a schematic plan view showing an area corresponding to two pixels of the active matrix substrate of Embodiment 2, each showing an embodiment corresponding to a dot inversion operation.

FIGS. 5(a) and 5(b) are plan views showing configurations suitable for the dot inversion operation, respectively showing an area generally corresponding to two pixels of Embodiment 1 and an area generally corresponding to two pixels of Embodiment 2.

In order to perform the dot inversion operation, the TFTs 6 of two adjacent pixels on top of each other are sometimes arranged to be staggered left and right, i.e., so that the source-drain directions are reversed from each other, as shown in FIGS. 5(a) and 5(b). In the illustrated arrangement, the upper pixel is connected to a source line 4 that lies on the right side, and the lower pixel is connected to a source line 4 that lies on the left side.

As shown in FIG. 5(a), with such an arrangement, if the drain electrode 15A is misaligned in the left-right direction in the TFT substrate 100 of Embodiment 1, whether the amount of change in Cgd increases or decreases is reversed between the oxide semiconductor TFTs 6 of the upper and lower pixels. That is, if the drain electrode 15A is shifted to the right, Cgd increases in the upper pixel of FIG. 5(a), whereas Cgd decreases in the lower pixel, thereby increasing the pixel-to-pixel variation of Cgd.

In contrast, as shown in FIG. 5(b), with the arrangement used in the TFT substrate 200 of Embodiment 2, even if the drain electrode 15A is shifted in the left-right direction, it will not change the overlapping area between the drain electrode and the gate electrode. Moreover, even if the drain electrode is shifted in the up-down direction, the upper and lower adjacent pixels will have the same degree of change of Cgd. (If Cgd increases in the upper pixel, Cgd of the lower pixel also increases.)

Thus, where the oxide semiconductor TFTs 6 are arranged to be staggered between the upper and lower pixels, it is possible to more effectively suppress the variation of the parasitic capacitance Cgd by employing the configuration of the TFT substrate 200.

With the TFT substrate 200, since it is possible to reduce the overlapping area between the source line 4 and the gate line 2, it is possible to realize an advantage that the load on the source line 4 and the load on the gate line 2 can be reduced as compared with the TFT substrate 100 of Embodiment 1.

(Embodiment 3)

A TFT substrate 300 of Embodiment 3 will now be described. Note that like components to those of the TFT substrate 100 of Embodiment 1 will be denoted by like reference numerals and will not be discussed redundantly.

FIG. 6(a) is a schematic plan view showing an area corresponding to one pixel of the TFT substrate 300 according to Embodiment 3 of the present invention. FIG. 6(b) is a schematic cross-sectional view of the TFT substrate 300 taken along line A-A' of FIG. 6(a).

As shown in FIGS. 6(a) and 6(b), in the TFT substrate 300, the source electrode 14 is formed so as to project from the source line 4, and the source electrode 14 is arranged within the oxide semiconductor layer 16. In the present embodiment, the source electrode 14 and the drain electrode 15A are formed so that the widths thereof are generally equal to each other.

In this way, it is possible to reduce the overlapping area between the source line 4 and the gate line 2. Thus, it is possible to reduce the load on the source line 4 and the load on the gate line 2, as in Embodiment 2.

While TFT substrates and liquid crystal display devices according to the embodiments of the present invention have been described above, it is understood that various modifications can be made thereto.

INDUSTRIAL APPLICABILITY

The embodiments of the present invention can suitably be used for display devices such as liquid crystal display devices. Since it is capable of reducing the variation of the device characteristic of an oxide semiconductor TFT, it is widely applicable to various devices having TFTs.

REFERENCE SIGNS LIST 2 gate line
4 source line
6 oxide semiconductor TFT
10 substrate
12 gate electrode
14 source electrode
15A drain electrode
15B drain connecting portion (contact portion)
16 oxide semiconductor layer
18 transparent shield electrode layer (first transparent conductive layer)
19 pixel electrode (second transparent conductive layer)
20 gate insulating layer 22 passivation layer
24 planarizing layer
26 second insulating layer
CH contact hole

The invention claimed is:

1. An active matrix substrate comprising:
a substrate;
a gate electrode on the substrate;
a gate insulating layer on the gate electrode;
an oxide semiconductor layer on the gate insulating layer, at least a portion of the oxide semiconductor layer overlapping with the gate electrode with the gate insulating layer interposed therebetween;
a source electrode and a drain electrode electrically connected to the oxide semiconductor layer, the source electrode and the drain electrode arranged to oppose each other with a gap therebetween;
a gate line connected to the gate electrode and extending in a first direction;
a source line connected to the source electrode and extending in a second direction crossing the first direction;
a drain connecting portion as an extended portion of the drain electrode;
a first insulating layer on the source electrode, the drain electrode, and the drain connecting portion;
a first transparent conductive layer on the first insulating layer, the first transparent conductive layer not overlapping the oxide semiconductor layer and the drain connecting portion;
a second insulating layer on the first transparent conductive layer; and
a second transparent conductive layer on the second insulating layer, the second transparent conductive layer electrically connected to the drain connecting portion through a contact hole in the first and the second insulating layers, and electrically insulated from the first transparent conductive layer, wherein
the drain connecting portion is larger than the contact hole, and is adjacent to the drain electrode,
the drain electrode extends from a connecting portion thereof for connection with the oxide semiconductor layer, across an edge of the gate electrode, and to the drain connecting portion, where a width of the drain electrode is smaller than a width of the drain connecting portion,
when viewed in a direction normal to the substrate, the source line includes a first edge extending across the oxide semiconductor layer in the second direction, the source electrode is a portion of the source line, and
the second transparent conductive layer covers an entirety of the drain connecting portion and includes and edge extending across the drain electrode in the second direction.

2. The active matrix substrate of claim 1, wherein a storage capacitor is defined by the first transparent conductive layer, the second insulating layer, and the second transparent conductive layer, and the drain connecting portion does not form a storage capacitor.

3. The active matrix substrate of claim 2, wherein:
the second transparent conductive layer includes a plurality of pixel electrodes; and
the first transparent conductive layer is provided so as to oppose the plurality of pixel electrodes, and includes a plurality of openings therein corresponding to areas including the oxide semiconductor layer and the drain connecting portion.

4. The active matrix substrate of claim 1, wherein a width of an end portion of the drain electrode that opposes the source electrode is equal to a width of a portion of the drain electrode that extends across the edge of the gate electrode.

5. The active matrix substrate of claim 1, wherein:
a linear edge is provided along an end portion of the drain electrode that opposes the source electrode, and a linear edge opposing the linear edge of the drain electrode and extending in a direction parallel to the linear edge of the drain electrode is formed along a portion of the source electrode that opposes the drain electrode; and
a length of the edge along the end portion of the drain electrode is different from a length of the edge of the source electrode.

6. The active matrix substrate of claim 5, wherein:
the oxide semiconductor layer has a planar shape of an island pattern; and
the source electrode extends linearly across the oxide semiconductor layer, and the linear edge of the source electrode is provided over an area where the source electrode extends linearly across the oxide semiconductor layer.

7. The active matrix substrate of claim 1, wherein a connecting portion between the source electrode and the oxide semiconductor layer, a connecting portion between the drain electrode and the oxide semiconductor layer, and the drain connecting portion are aligned together.

8. The active matrix substrate of claim 7, further comprising:
a gate line connected to the gate electrode; and
a source line connected to the source electrode and extending across the gate line,
wherein the connecting portion between the source electrode and the oxide semiconductor layer, the connecting portion between the drain electrode and the oxide semiconductor layer, and the drain connecting portion are aligned together along the source line.

9. The active matrix substrate of claim 1, wherein a width of the drain connecting portion is 10 µm or more and 15 µm or less, and a width of the drain electrode is 1 µm or more and 6 µm or less.

10. The active matrix substrate of claim 1, wherein the oxide semiconductor layer is formed by an In—Ga—Zn—O-based oxide semiconductor.

11. The active matrix substrate of claim 10, wherein the In—Ga—Zn—O-based oxide semiconductor is crystalline.

12. A direct viewing-type liquid crystal display device comprising:
an active matrix substrate of claim 1;
a counter substrate arranged so as to oppose the active matrix substrate; and
a liquid crystal layer held between the active matrix substrate and the counter substrate,
wherein the second transparent conductive layer includes a pixel electrode, and the liquid crystal display device is driven in a vertical electric field mode.

13. The active matrix substrate of claim 1, wherein,
when viewed in the direction normal to the substrate, the gate line includes a second edge extending in the first direction,
the gate electrode is a protrusion extending from the second edge in the second direction, and
the first edge of the source line extends across the gate electrode in the second direction.

* * * * *